US010447208B2

(12) United States Patent
Bettencourt et al.

(10) Patent No.: US 10,447,208 B2
(45) Date of Patent: Oct. 15, 2019

(54) AMPLIFIER HAVING A SWITCHABLE CURRENT BIAS CIRCUIT

(71) Applicant: Raytheon Company, Waltham, MA (US)

(72) Inventors: John P. Bettencourt, Boxford, MA (US); Valery S. Kaper, Winchester, MA (US); Steven M. Lardizabal, Westford, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/843,922

(22) Filed: Dec. 15, 2017

(65) Prior Publication Data

US 2019/0190456 A1    Jun. 20, 2019

(51) Int. Cl.
*H03F 3/04* (2006.01)
*H03F 1/02* (2006.01)
*H03F 3/193* (2006.01)
*H03F 1/30* (2006.01)
*H03F 1/22* (2006.01)
*H03F 3/345* (2006.01)
*H01L 29/20* (2006.01)

(52) U.S. Cl.
CPC ....... *H03F 1/0222* (2013.01); *H01L 29/2003* (2013.01); *H03F 1/223* (2013.01); *H03F 1/306* (2013.01); *H03F 3/193* (2013.01); *H03F 3/345* (2013.01)

(58) Field of Classification Search
CPC ........ H03F 1/0222; H03F 3/345; H03F 1/306; H03F 3/193; H03F 1/223
USPC ................... 330/285, 296, 288, 51
See application file for complete search history.

(56) References Cited

U.S. PATENT DOCUMENTS 3,506,932 A    4/1970   Beurrier
4,896,121 A    1/1990   Larson
(Continued)

FOREIGN PATENT DOCUMENTS

EP    2 816 729 A1      12/2014
WO    WO 97/23037         6/1997
WO    WO 2016/205049 A1  12/2016

OTHER PUBLICATIONS

Fred Bonn, Bias Schemes for Enhancement and Depletion Mode GaAsFETS in Source-Follower Configuration, Motorola, Inc. Technical Developments, Mar. 1993, vol. 18, pp. 88-90, 3 pages.

(Continued)

*Primary Examiner* — Khanh V Nguyen
*Assistant Examiner* — Khiem D Nguyen
(74) *Attorney, Agent, or Firm* — Daly, Crowley, Mofford & Durkee, LLP

(57) ABSTRACT

A circuit having (A) a transistor; (B) a bias circuit for providing setting a bias current for the transistor, the bias current having a current level in accordance with a reference current fed to the bias circuit; and (C) a bias current level controller, comprising: (i) a plurality of switches, each one of the switches comprises: a MOS FET and a GaN FET connected in a cascode configuration; and (ii) current source circuitry, comprising a plurality of current sources, each one of the current sources being connected between a voltage source and a corresponding one of the plurality of switches, the current source circuit combining currents produced by the current source in response a binary control signal fed to a gate of the MOS FET, the combined current providing the reference current fed to the bias circuit.

7 Claims, 1 Drawing Sheet

(56) References Cited

U.S. PATENT DOCUMENTS

| | | | |
|---|---|---|---|
| 5,570,069 | A | 10/1996 | Franke |
| 5,570,090 | A | 10/1996 | Cummins |
| 5,892,400 | A | 4/1999 | van Saders et al. |
| 5,952,860 | A | 9/1999 | van Saders et al. |
| 6,600,301 | B1 | 7/2003 | DeFalco |
| 6,831,517 | B1 | 12/2004 | Hedberg et al. |
| 7,015,771 | B2 | 3/2006 | Pelz |
| 7,876,157 | B1 | 1/2011 | Kang et al. |
| 7,928,804 | B2 | 4/2011 | Yamamoto et al. |
| 8,017,978 | B2 | 9/2011 | Lidow et al. |
| 8,854,140 | B2 | 10/2014 | Bettencourt |
| 9,166,533 | B2 | 10/2015 | Marra et al. |
| 2010/0039168 | A1 | 2/2010 | Bettencourt |
| 2011/0025422 | A1 | 2/2011 | Marra et al. |
| 2014/0027785 | A1 | 1/2014 | Rose |
| 2016/0373074 | A1 | 12/2016 | Bettencourt et al. |
| 2017/0084600 | A1 | 3/2017 | Isobe |

OTHER PUBLICATIONS

Kazior, T.E.; Chelakara, R.; Hoke, W.; Bettencourt, J.; Palacios, T.; Lee, H.S. "High Performance Mixed Signal and RF Circuits Enabled by the Direct Monolithic Heterogeneous Integration of GaN HEMTs and Si CMOS on a Silicon Substrate", Compound Semiconductor Integrated Circuit Symposium (CSICS), Nov. 2011 IEEE DOI: 10.1109/CSICS.2011.6062443, pp. 1-4.

Wang, Zhang, Honea, Jim, Shi, Yuxiang, Hui, Li, Investigation of Driver Circuits for GaN HEMTs in Leaded Packages, IEEE, Mar. 2014, pp. 81-87 (7 pages).

PCT Notification of Transmittal of International Search Report and the Written Opinion of the International Searching Authority, or the Declaration, PCT/US2016/036546; dated Sep. 16, 2016, 1 page.

PCT International International Search Report, PCT/US2016/036546, dated Sep. 16, 2016, 6 pages.

PCT Written Opinion of the ISA, PCT/US2016/036546; dated Sep. 16, 2016, 7 pages.

Office Action dated Sep. 28, 2018 for U.S. Appl. No. 15/870,155; 10 Pages.

Terminal Disclaimer and Response to Office Action dated Sep. 28, 2018 for U.S. Appl. No. 15/870,155, filed Oct. 4, 2018; 8 Pages.

A.Gámez-Machado, D. Valdés-Martín, A. López, J. Gismero-Menoyo, Microscript-to-stripline planar transitions on LTCC, 2011, IEEE, 4 pages.

C.Y. Ng, M. Chongeheawchamnan, I.D. Robertston, Miniature Ka-Band I/Q Vector Modulator using 3D-MMIC Technology, $33^{rd}$ European Microwave Conference, Munich 2003, 4 pages.

Juno Kim, Hai-Young Lee, Tatsuo Itoh, Novel Microstrip-to-Microstrip Transactions for Leakage Supression in Multilayer Microwave Circuits, 1998, IEEE, 4 pages.

Velijko Crnadak, Siniša Tasic, Improved VHF Quadrature Hybrid Coupler, 2016, IEEE, 4 pages.

PCT Notification of Transmittal of International Preliminary Report on Patentability (Chapter I of the Patent Cooperation Treaty), PCT/US2016/036546; dated Dec. 28, 2017, 1 page.

PCT International Preliminary Report on Patentability, PCT/US2016/036546, dated Dec. 28, 2017, 1 page.

PCT Written Opinion of the ISA, PCT/US2016/036546; dated Dec. 28, 2017, 6 pages.

Notification of Transmittal of the International Search Report and the Written Opinion of the ISA dated Feb. 22, 2019 for International Application No. PCT/US2018/063206; 1 Page.

International Search Report dated Feb. 22, 2019 for International Application No. PCT/US2018/063206; 4 Pages.

Written Opinion of the ISA dated Feb. 22, 2019 for International Application No. PCT/US2018/063206; 8 Pages.

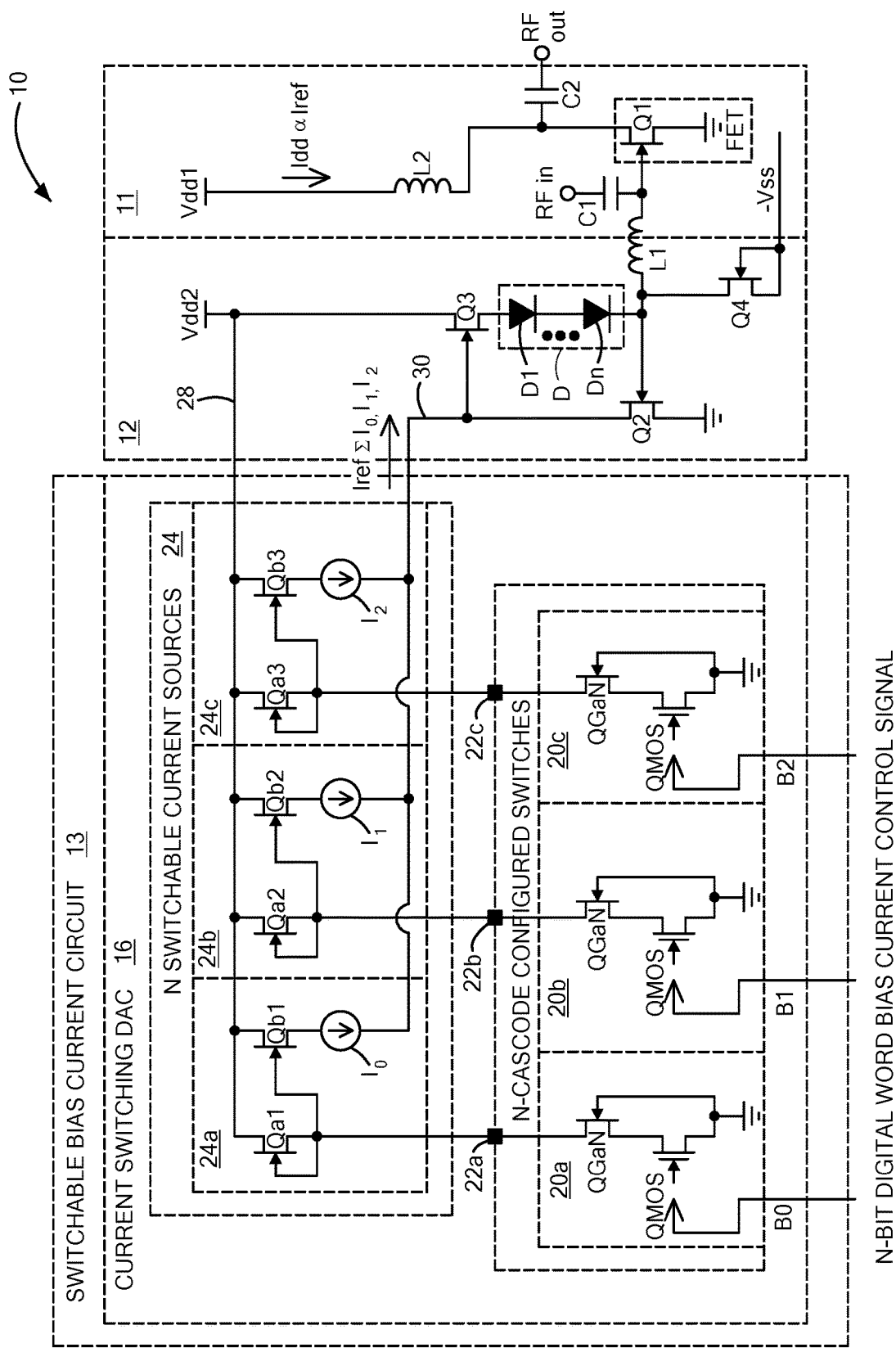

AMPLIFIER HAVING A SWITCHABLE CURRENT BIAS CIRCUIT

TECHNICAL FIELD

This disclosure relates generally to switchable current bias circuitry and more particularly switchable current bias circuitry for Gallium Nitride (GaN) amplifiers having relatively high standoff voltages and controllable using relatively low voltage Complementary Metal Oxide Semiconductor (CMOS) control circuitry.

BACKGROUND

As is known in the art, GaN Heterojunction Electron Mobility Transistor (HEMT) devices are finding their way into many Radio Frequency (RF) amplifier and power electronics applications with standoff (drain supply) voltages in the range of tens of volts to hundreds of volts. In these applications it may be required to set the quiescent bias condition of the HEMT to one of several conditions; for example in amplification applications it might be necessary to switch between Class A, A/B, B and standby (off) biasing condition. Also it is necessary that the bias classification or quiescent current condition be achieved in the presence of HEMT process variations. Additionally in a multiple biasing scenario it is desirable that the voltage command signals used to set the biasing point of the high voltage HEMTs come from interface circuitry, such as low voltage CMOS circuitry. Typically these signals are 2.5 volts or less and the underlying circuitry is unable to tolerate the high supply voltages of the GaN HEMT.

SUMMARY

In accordance with the present disclosure, a circuit is provided having (A) transistor, (B) a bias circuit for setting a bias current for the transistor, the bias current having a current level in accordance with a reference current fed to the bias circuit; and (C) a bias current level controller, comprising: (i) a plurality of switches, each one of the switches comprises: a MOS FET and a GaN FET connected in a cascode configuration; and (ii) current source circuitry, comprising a plurality of current sources, each one of the current sources being connected between a voltage source and a corresponding one of the plurality of switches, the current source circuitry combining currents produced by the current source in response a binary control signal fed to a gate of the MOS FET, the combined current providing the reference current fed to the bias circuit.

In one embodiment, each one of the plurality of current sources produces a different current level.

In one embodiment, the binary control signal has a selected one of either a low voltage level or a high voltage level and wherein the voltage supply has a voltage greater than the high voltage level.

In one embodiment, the binary control signal changes between a first range of voltages R1 and a voltage at outputs of the switches changes between a second range of voltages R2, where R2 is greater than R1.

In one embodiment, the transistor of the amplifier is a GaN depletion mode HEMT FET.

In one embodiment, a circuit is provided having: an amplifier comprising: a transistor having a source electrode and a drain electrode, one of the source electrode and the drain electrode being coupled a reference potential; another one of the source electrode and drain electrode coupled to a potential more positive than a reference potential; and a gate electrode for coupling to an input signal. The circuit includes a bias circuit for setting a bias current for the amplifier, the bias current passing between the source electrode and the drain electrode of the amplifier, the bias current having a current level in accordance with a reference current fed to the bias circuit. A bias current level controller is provided, comprising: a plurality of switches, each one of the switches comprising: a MOS FET and a GaN FET connected in a cascode configuration, the MOS FET and the GaN fed being coupled to the reference potential; and a current switching circuitry, comprising a plurality of current sources, each one of the current sources being connected between a voltage source and a corresponding one of the plurality of switches, the current switching circuit combining currents produced by the plurality of current sources in response a corresponding one of a plurality of bits of a digital word fed to a gate of the MOS FET of a corresponding one of the plurality of current sources, the combined current providing the reference current fed to the bias circuit.

In one embodiment, a circuit is provided comprising: a transistor; a bias circuit for setting a bias current for the transistor, the bias current having a current level in accordance with a reference current fed to the bias circuit; and a bias current level controller, comprising: a plurality of switches; and current source circuitry, comprising a plurality of current sources, each one of the current sources being connected between a voltage source and an output of a corresponding one of the plurality of switches, the current source circuitry combining currents produced by each one of the current sources in response a binary control signal fed a corresponding one of the plurality of switches, the combined current providing the reference current fed to the bias circuit; and wherein the binary control signal changes between a first range of voltages R1 and a voltage at the output of each one of the switches changes between a second range of voltages R2, where R2 is greater than R1.

With such an arrangement, a current switching bias circuit is provided for a HEMT FET. The cascode configured switches include a low voltage MOSFET and a high voltage GaN HEMT, allowing low voltage signals, typically generated by silicon CMOS controllers (<2.5 Volts) providing the N-bit digital control signal, to thereby set any desired bias current to the GaN HEMT with such FET operating with a high drain supply voltage and thereby enable the FET to switch between Class A, A/B, B and standby (off) biasing conditions, for example.

In one embodiment, a switchable current bias circuit for a transistor is provided comprising: a plurality of N cascode configured switches, each one of the plurality of N cascode connected switches being fed by a corresponding bit of an N-bit digital word, each one of the switches comprising: a MOS FET and a Depletion mode GaN FET connected in a cascode configuration between ground and an output terminal; and current source circuitry comprising a plurality of N current sources, each one of the N current sources being connected to a corresponding one of the N cascode configured switches, each one of the plurality of N current sources. Each one of the N cascode configured switches controls an "on" or "off" condition to a corresponding one of the N current sources selectively in accordance with bit fed to the such one of the N cascode configured switches. The current source circuitry combines currents produced at outputs of the current sources in response to the "on" condition on the output, such combined currents being produced on the output bus. An amplifier includes: the transistor; and bias circuitry connected to the output bus and fed to the combined currents, such transistor being fed a bias current having a current level in accordance with the combined currents, In one embodiment, a switchable current bias circuit is provided for a transistor, comprising: a current switching DAC, the DAC comprising: a bias current control signal for producing an N-bit digital word, here N is an integer greater than one, representative of one of $2^N$ bias current levels selected by the control signal; a plurality of N cascode configured switches, each one of the plurality of N cascode connected switches being fed by a corresponding bit of the N-bit digital word, each one of the switches comprising: a MOS FET and a Depletion mode GaN FET connected in a cascode configuration between ground and an output terminal; and current circuitry comprising a plurality of N current sources, each one of the N current sources being connected to a corresponding one of the N cascode configured switches, each one of the plurality of N current sources being connected between a voltage supply bus and an output bus. Each one of the N cascode configured switches controls an "on" or "off" condition of a corresponding one of the N current sources selectively in accordance with the N-bit digital control signal produced by the controller. The current source circuitry combines currents produced at outputs of the current sources in response to the "on" condition on the output, such combined currents being produced on the output bus. An amplifier comprising: the transistor, and bias circuitry connected to the output bus, the combined currents on the output bus setting a bias current for the transistor, such bias current passing through the transistor from a second voltage source, the bias current fed to the transistor having a current level in accordance with the combined currents on the output bus.

The details of one or more embodiments of the disclosure are set forth in the single FIGURE and the description below. Other features, objects, and advantages of the disclosure will be apparent from the description and drawing and from the claims.

BRIEF DESCRIPTION OF DRAWING

The single FIGURE a simplified schematic diagram of an amplifier having a switchable current bias circuit according to the disclosure.

DETAILED DESCRIPTION

Referring now to the FIGURE, a circuit 10 is shown having an amplifier 11 and a bias circuit 12; and a bias current level controller 13. The amplifier 11, here a radio frequency (RF Amp), comprising: a HEMT GaN depletion mode transistor Q1 having a source electrode coupled to a reference potential, here ground; a drain electrode coupled to a potential more positive than the reference potential, here (+Vdd1, here for example, +28 volts) through an inductor L2, as shown, the drain electrode providing an amplified RF output after passing through a capacitor, C2, as shown; and a gate electrode for coupling to an input signal, here an RF input through a capacitor, C1, as shown. It is noted that the source electrode of the transistor Q1 is connected to ground, as shown.

The bias circuit 12 includes biasing circuitry (HEMT GaN depletion mode transistors Q2, Q3, and Q4 and GaN diodes D1-Dn) arranged as shown, coupled to the switchable bias current circuit 13 and fed current Iref from the switchable bias current circuit 13 and connected between Vdd2, here for example +28 volts, and a Vss, here for example −8 volts. It should be noted that the diode section D includes a plurality of n serially connected GaN diodes D1-Dn, where n is the number of diodes in the series selected in accordance with the voltages used, here for example, Vdd2 is +28 volts and Vss is −8.0 volts. It is noted that FET Q2 of the bias circuit 12 forms a current mirror with FET Q1 and the current Iref fed the bias circuit 12 from the switchable bias current circuit 13 is thereby mirrored to set the level of the bias current Idd for the FET Q1 of amplifier 11. It is also noted that FET Q3, diodes D1-Dn, and FET Q4 form a source follower network that feeds the signal at the drain of FET Q2 back to the gate of FET Q2.

The switchable bias current circuit 13 includes: a current switching DAC 16, the DAC 16 being fed an N-bit word, where N is an integer greater than one, here for example N is three and 3 bit digital word is B0 B1 B2; where B0 is the least significant bit and B2 is the most significant bit. The DAC 16 includes a plurality of N cascode configured switches 20a-20c. Each one of the plurality of N cascode connected switches 20a-20c is fed by a corresponding bit, B0-B3, of the N-bit digital word; thus switch 20a is fed by bit B0, the least significant bit, switch 20b is fed by bit B1, and switch 20c is fed by the bit B3, here the most significant bit. Each one of the switches 20a-20c includes a MOS FET QMOS and a Depletion mode GaN FET QGaN connected in a cascode configuration between ground and an output terminal 22a-22c, respectively, as shown. More particularly, the gate of the GaN FET QGaN is connected to ground; whereas if the CMOS FET QMOS is an nMOS FET, the source of such nMOS FET is also connected to ground whereas if the CMOS FET QMOS is a pMOS FET, the drain of such pMOS FET would be connected to ground. It is noted that the bits B0-B2 are connected to the gates of the CMOS FETS of switches 20a-20c, respectively, as shown. Here, when the logic state of one of the bits is logic 1, the one of the switches 20a-20c fed by such logic 1 bit produces a voltage on the one of the output terminals 22a-22c connected thereto that goes towards grounds and when the logic state of one of the bits is a logic 0, the one of the switches 20a-20c fed by such logic 0 bit produces a voltage on the one of the output terminals 22a-22c connected thereto of +28 volts.

The DAC 16 includes a current source circuitry 24 comprising a plurality of N current sources 24a-24c, as shown, each one of the N current sources 24a-24c being connected to a corresponding one of the output terminal 22a-22c of a corresponding one of the N cascode configured switches 20a-20c, respectively, as shown. Each one of the plurality of N current sources 24a-24c is connected between a voltage supply bus 28, here +28 volts (Vdd2) and an output bus 30. The output bus 30 is connected to the gate of GaN FET Q3 and to the drain of GaN FET Q2. The source of GaN FET Q2 is connected to ground. The drain of GaN FET Q3 is connected to Vdd2 and the source of GaN FET Q3 is connected to: the gate of FET Q2 through the diode section D; to the gate of GaN FET Q1 through an inductor L1; and to the drain of GaN FET Q4. The gate and source of the GaN FET Q4 are connected together and to −Vss, as shown.

Each one of the N cascode configured switches 20a-20c controls an "on" or "off" condition of a corresponding one of the N current sources 24a-24c selectively in accordance with the voltage produced on the one of the output terminals 22a-22c connected thereto. More particularly, when the voltage at the output terminals 22a-22c is +28 volts the corresponding one of the current sources 24a-24c is the "on" condition whereas when the voltage at the output terminals 22a-22c goes towards ground is tends towards ground the corresponding one of the current sources 24a-24c is in the "off" condition".

Each one of the N current sources 24a-24c includes a pair of depletion mode GaN FETs Qa1, Qb1-Qa3, Qa3, respectively, as shown. The gates of Qa1-Qa3 are connected to the sources of Qa1-Qa3, respectively, as shown and also to the gates of Qb1-Qb3, respectively, as shown. The drains of Qa1, Qb1-Qb3, Qa3, are connected to Vdd2, as shown. The sources of Qb1-Qb3 are connected to current sources $I_0$-$I_2$, respectively, as shown.

The current source circuitry 24 combines currents $I_0$-$I_2$ produced at outputs of the current source circuits 24a-24c, respectively, in response to the "on" condition on the output terminals 22a-22c, respectively, such combined currents $\Sigma I_0$, $I_1$, $I_2$; ($I_0+I_1+I_2$) being produced on the output bus 30 as a reference current Iref fed to the bias circuit 12. The reference current Iref is mirrored by the bias circuit 12 into the drain current Idd fed to the FET Q1 through inductor L2. In this example, the voltages of the binary, or logic, signals or bits B0 to B1, are 0 volts (or ground) representing a logic 0 state or +2.5 volts representing a logic 1 state. As noted above, when a logic 1 is fed to the gate of the MOS FET QMOS, such MOS FET is placed in a conducting or "on" condition in which case current is allowed to flow through the cascode GaN transistor, on the other hand when a logic 0 is fed to the gate of the MOS FET, such MOS FET QGaN is placed in an "off" or non-condition in which case no current is allowed to conduct through the cascode GaN transistor.

More particularly, here, the size of the GaN FET Qa1 is scaled relative to the cascode connected GaN/CMOS pair of switch 20a and gate of Qb1 to provide sufficient voltage swing to turn on and off Qb1. At the source output of FET Qb1 is a current source $I_0$. Here, the size of the GaN FET Qa2 is scaled relative to the cascode connected GaN/CMOS pair of switch 20b and gate of Qb2 to provide sufficient voltage swing to turn on and off Qb2. Here, the size of the GaN FET Qa3 is scaled relative to the cascode connected GaN/CMOS pair of switch 20c and gate of Qb3 to provide sufficient voltage swing to turn on and off Qb3. As noted above, the sources of Qb1-Qb3 are connected to current sources $I_0$-$I_2$, respectively, as shown. These current sources $I_0$-$I_3$ may be of any conventional design such as for example, a resistor, or a semiconductor resistor in saturation or a transistor configured as a current source. These current sources in each of the current switches 24a-24c, can provide different amounts of current so that each one of the of the N current sources 24a-24c produces a different amount of current on a common current bus 30 when placed in a conducting condition by the voltages on outputs 22a-22c, respectively. Depletion FET Qb1-Qb3 are typically scaled relative to the current sources $I_0$-$I_3$, respectively, so that it remains in transistors Qb1-Qb3 linear operation condition. Here, for example current source 24a produces 75 milliamps, current source 24b produces 150 milliamps and current source 24c produces 275 milliamps, when placed in a conducting, or "on" condition, when a voltage of, here for example +2.5 volts, is produced on the connected one of the output terminals 20a-20c, respectively; otherwise, each one of the N current sources 24a-24c is in a non-conducting, or "off" condition when a voltage of nearly +28 volts is produced on the connected one of the outputs 22a-22c, respectively. Here, in this example, when bit B0 is a logic 0, the voltage on output 22a is approximately 28 volts and current source 24a is placed in a conducting condition and feeds 75 milliamps to the common current bus 30 and when bit B0 is logic 1, the voltage on output 22a is approximately ground (zero volts) and the current source 24a is in a non-conducting condition and hence current source 24a does not pass any current to the common current bus 30; when bit B1 is a logic 0, the voltage on output 22b is approximately 28 volts and the current source 24b is placed in a conducting condition and feeds 150 milliamps to the common current bus 30 and when bit B1 is logic 1, the voltage on output 22b is approximately zero volts and the current source 24b is in a non-conducting condition and hence current source 24b does not pass any current to the common current bus 30; and when bit B2 is a logic 0 the voltage on output 22c is approximately 28 volts current source 24c is placed in a conducting condition and feeds 275 milliamps to the common current bus 30 and when bit B2 is logic 1, the voltage on output 22c is approximately zero volts and the current source 24c is in a non-conducting condition and hence current source 24c does not pass any current to the common current bus 30. Reference is made to a TABLE I below:

TABLE I

| Iref | B2 | B1 | B0 |
| --- | --- | --- | --- |
| 0 milliamps | 1 | 1 | 1 |
| 75 milliamps | 1 | 1 | 0 |
| 225 milliamps | 1 | 0 | 1 |
| 275 milliamps | 1 | 0 | 0 |
| 350 milliamps | 0 | 1 | 1 |
| 425 milliamps | 0 | 0 | 1 |
| 500 milliamps | 0 | 0 | 0 | showing the relationship between the logic states of BITS B0, B1 and B2 and the reference current Iref on common current bus 30. It is noted that the voltage swing of bits B0-B1 is between ground and +2.5 volts while the voltage swing on outputs 24a-24c is between +28 volts and zero volts. Thus, the binary control signal B0-B2 changes between a first range of voltages R1 (zero to +2.5 volts) and a voltage at outputs of the switches changes between a second range of voltages R2 (zero to +28 volts), where R2 is greater than R1.

The current on bus 30, Iref, produced by the bias current level controller 13, passes through FET Q2 to ground and is mirrored by bias circuit 12 to FET Q1, producing a current in FET Q1 proportional to ($\propto$) Iref, that is K times Iref, (where K is the ratio of the unit gate periphery of FET Q1 to the unit gate periphery of FET Q2) which current K times Iref passes from Vdd1 through the inductor L2 and then through FET Q1 to ground. Thus, the current on bus 30, Iref, which is selected by the N-bit digital control signal thereby sets the bias current Idd for the FET Q1, the bias current Idd passing between the source electrode and the drain electrode of the FET Q1 of the amplifier 11, having a current level in accordance with the K times Iref. Thus, the N-bit digital control signal may be used to set any desired bias current to the GaN HEMT Q1 with such FET Q1 operating with a high drain supply voltage Vdd1 and thereby enables the FET Q1 to switch between Class A, A/B, B and standby (off) biasing conditions, for example.

A number of embodiments of the disclosure have been described. Nevertheless, it will be understood that various modifications may be made without departing from the spirit and scope of the disclosure. For example, while the MOS FETs are here described as nMOS devices they may be pMOS in which case a logic 1 is zero and a logic 0 is −2.5 volts. Further, while the circuit 10 has been described using Depletion mode GaN FETs, the circuit can be modified to operate with Enhancement mode FETs. Accordingly, other embodiments are within the scope of the following claims.

What is claimed is:

1. A circuit, comprising:
a transistor;
a bias circuit for setting a bias current for the transistor, the bias current having a current level in accordance with a reference current fed to the bias circuit on a reference current bus; and
a bias current level controller, comprising:
a plurality of switches, each one of the switches comprises: a MOS FET and a GaN FET connected in a cascode configuration; and
current source circuitry, comprising a plurality of current sources, each one of the current sources being connected between a voltage source and the reference current bus through a corresponding one of the plurality of switches, the bias level controller combining currents produced by the current source in response a binary control signal fed to a gate of the MOS FET of a corresponding one of the switches, the combined current providing the reference current fed to the bias circuit on the reference current bus.

2. A circuit, comprising:
an amplifier comprising:
a transistor having a source electrode and a drain electrode, one of the source electrode and the drain electrode being coupled a reference potential;
another one of the source electrode and drain electrode coupled to a potential more positive than the reference potential; and a gate electrode for coupling to an input signal,
a bias circuit for setting a bias current for the amplifier, the bias current passing between the source electrode and the drain electrode of the amplifier, the bias current having a current level in accordance with a reference current fed to the bias circuit on a reference current bus; and
a bias current level controller, comprising:
a plurality of switches, each one of the switches comprising: a MOS FET and a GaN FET connected in a cascode configuration, the MOS FET and the GaN being coupled to the reference potential; and
a current switching circuitry, comprising a plurality of current sources, each one of the current sources being connected between a voltage source and the reference current bus through a corresponding one of the plurality of switches, the bias current level controller combining currents produced by the plurality of current sources in response a corresponding one of a plurality of bits of a digital word fed to a gate of the MOS FET of a corresponding one of the plurality of current sources, the combined current providing the reference current fed to the bias circuit on the reference current bus.

3. The switchable current circuit recited in claim 1 wherein each one of the bits has a selected one of either a low voltage level or a high voltage level and wherein the voltage source has a voltage greater than the high voltage level.

4. A switchable current bias circuit for a transistor, comprising:
a plurality of N cascode configured switches, each one of the plurality of N cascode connected switches being fed by a corresponding bit of an N-bit digital word, each one of the switches comprising: a MOS FET and a GaN FET connected in a cascode configuration between ground and an output terminal, where N is an integer greater than 1;
a current source circuit comprising a plurality of N current sources, each one of the N current sources being connected to the output terminal of a corresponding one of the N cascode configured switches;
wherein each one of the N cascode configured switches controls an "on" or "off" condition of a corresponding one of the N current sources selectively in accordance with the bit fed to the such one of the N cascode configured switches;
wherein the current source circuit combines currents produced at outputs of the current source circuits in response to the "on" or the "off" condition, such combined currents being produced on an output bus; and an amplifier, such amplifier comprising:
the transistor; and
bias circuitry connected to the output bus and fed to the combined currents, such transistor being fed a bias current having a current level in accordance with the combined currents.

5. A switchable current bias circuit for a transistor, comprising:
a current switching circuit comprising:
a controller fed by a bias current control signal for producing an N-bit digital word, where N is an integer greater than one, representative of one of $2^N$ bias current levels selected by the control signal;
a plurality of N cascode configured switches, each one of the plurality of N cascode connected switches being fed by a corresponding bit of the N-bit digital word, each one of the switches comprising: a MOS FET and a GaN FET connected in a cascode configuration between ground and an output terminal;
a current source circuit comprising a plurality of N current sources, each one of the N current sources being connected to the output terminal of a corresponding one of the N cascode configured switches, each one of the N current sources being connected between a voltage supply bus and an output bus;
wherein each one of the N cascode configured switches controls an "on" or "off" condition of a corresponding one of the N current sources selectively in accordance with the N-bit digital control signal produced by the controller;
wherein the current source circuit combines currents produced at outputs of the current source circuits in response to the "on" or the "off" condition on the output, such combined currents being produced on the output bus; and
an amplifier, such amplifier comprising:
the transistor; and
bias circuitry connected to the output bus, the combined currents on the output bus setting a bias current for the transistor, such bias current passing to the transistor from a second voltage source, the bias current fed to the transistor having a current level in accordance with the combined currents on the output bus.

6. A circuit, comprising:
a transistor;
a bias circuit for setting a bias current for the transistor, the bias current having a current level in accordance with a reference current fed to the bias circuit through a current reference bus; and a bias current level controller, comprising:
  a plurality of switches; and
  current source circuitry, comprising a plurality of current sources, each one of the current sources being connected between a voltage source and the reference current bus through and an output of a corresponding one of the plurality of switches, the current source circuitry combining currents produced by each one of the current sources in response a binary control signal fed a corresponding one of the plurality of switches, the combined current providing the reference current fed to the bias circuit on the reference current bus; and
  wherein the binary control signal changes between a first range of voltages R1 and a voltage at the output of each one of the switches changes between a second range of voltages R2, where R2 is greater than R1.

7. The circuit recited in claim 6 wherein each one of the switches comprises: a MOS FET and a GaN FET connected in a cascode configuration.

\* \* \* \* \*